(12) United States Patent
Shibata et al.

(10) Patent No.: US 9,627,846 B2
(45) Date of Patent: Apr. 18, 2017

(54) LIGHT-EMITTING ELEMENT MODULE, QUANTUM INTERFERENCE APPARATUS, ATOMIC OSCILLATOR, ELECTRONIC APPARATUS AND MOVING OBJECT

(71) Applicant: Seiko Epson Corporation, Tokyo (JP)

(72) Inventors: Tsunenori Shibata, Fujisawa (JP); Yoshiyuki Maki, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/574,590

(22) Filed: Dec. 18, 2014

(65) Prior Publication Data
US 2015/0180199 A1 Jun. 25, 2015

(30) Foreign Application Priority Data
Dec. 20, 2013 (JP) ................. 2013-263489

(51) Int. Cl.
| | | |
|---|---|---|
| *H01S 5/024* | (2006.01) | |
| *H01S 5/0687* | (2006.01) | |
| *H01S 5/022* | (2006.01) | |
| *H01L 27/15* | (2006.01) | |
| *H01L 27/18* | (2006.01) | |

(Continued)

(52) U.S. Cl.
CPC ........ *H01S 5/02415* (2013.01); *H01S 5/0687* (2013.01); *H01L 27/15* (2013.01); *H01L 27/153* (2013.01); *H01L 27/156* (2013.01); *H01L 27/16* (2013.01); *H01L 27/18* (2013.01);
(Continued)

(58) Field of Classification Search
CPC .............. G02B 6/12026; G02B 6/4201; H01S 5/02453; H01S 5/02284; H01S 5/06804; H01S 3/0941; H01S 5/02415; H01S 5/0612; H01S 4/00; H01S 5/02276; H01S 5/183; F21V 29/00; H03L 7/26; H03B 17/00; H01L 2224/48091; H01L 2224/48137; H01L 27/15–27/156
See application file for complete search history.

(56) References Cited

U.S. PATENT DOCUMENTS

| | | | | |
|---|---|---|---|---|
| 4,068,022 A | * | 1/1978 | Glick | ....... H01B 1/00 257/762 |
| 2004/0136001 A1 | * | 7/2004 | Nishimura | ..... H01S 5/02252 356/416 |

(Continued)

FOREIGN PATENT DOCUMENTS

JP 2013-162031 A 8/2013

*Primary Examiner* — Jessica Manno
*Assistant Examiner* — Mohammed R Alam
(74) *Attorney, Agent, or Firm* — Harness, Dickey & Pierce, P.L.C.

(57) ABSTRACT

A light-emitting element module includes a temperature adjustment element, a light-emitting element arranged on a temperature adjustment surface of the temperature adjustment element, a metal layer arranged on the temperature adjustment surface, a relay member arranged on the temperature adjustment surface through the metal layer, a wiring layer arranged on a surface of the relay member at an opposite side to the temperature adjustment surface, a wiring to electrically connect the light-emitting element and the wiring layer, and a wiring to electrically connect a connection electrode and the wiring layer. The wiring layer has an area smaller than an area of a region where the metal layer overlaps the relay member in a plan view.

15 Claims, 10 Drawing Sheets

(51) Int. Cl.
　　　*H01L 27/16*　　　(2006.01)
　　　*H01L 27/22*　　　(2006.01)
　　　*H01L 27/20*　　　(2006.01)

(52) U.S. Cl.
　　　CPC .............. *H01L 27/20* (2013.01); *H01L 27/22* (2013.01); *H01S 5/02276* (2013.01)

(56) References Cited

U.S. PATENT DOCUMENTS

| | | | |
|---|---|---|---|
| 2007/0237196 A1* | 10/2007 | Oomori | H01S 5/02236 372/36 |
| 2010/0178012 A1* | 7/2010 | Kanemoto | G02B 6/4204 385/88 |
| 2013/0200955 A1 | 8/2013 | Chindo | |

\* cited by examiner

LIGHT-EMITTING ELEMENT MODULE, QUANTUM INTERFERENCE APPARATUS, ATOMIC OSCILLATOR, ELECTRONIC APPARATUS AND MOVING OBJECT

BACKGROUND

1. Technical Field

The present invention relates to a light-emitting element module, a quantum interference apparatus, an atomic oscillator, an electronic apparatus and a moving object.

2. Related Art

A light-emitting element module is known in which a light-emitting element is temperature-adjusted by a temperature adjustment element (see, for example, JP-A-2013-162031 (Patent Literature 1)). Such light-emitting element module is used for an equipment in which the light-emitting state of the light-emitting element is required to be controlled at high precision, for example, an atomic oscillator which oscillates based on an energy transition of atoms of alkali metal such as rubidium or cesium.

For example, the light-emitting element module disclosed in Patent Literature 1 includes a Peltier element (temperature adjustment element) and a semiconductor laser (light-emitting element) mounted on the Peltier element, and these are housed in a package. Besides, in the light-emitting element module disclosed in Patent Literature 1, an insulation member is disposed on the Peltier element, and a halfway part of a wiring to electrically connect an electrode on the light-emitting element and an electrode on the package is connected to a pad on the insulation member. By this, the wiring is also temperature-adjusted, and the light-emitting element can be temperature-adjusted at high precision.

However, in the light-emitting element module disclosed in Patent Literature 1, since a large electrostatic capacitance is generated between the electrode on the insulation member and the metal layer on the Peltier element, when a high frequency signal is used as a drive signal of the light-emitting element, there is a problem that loss of the drive signal is large. For example, in an atomic oscillator of a type using a quantum interference effect (CPT: Coherent Population Trapping) of two kinds of lights different in wavelength, since the high frequency signal is generally used as the drive signal, and two kinds of lights different in wavelength are emitted from one semiconductor laser, such problem occurs.

SUMMARY

An advantage of some aspects of the invention is to provide a light-emitting element module in which temperature variation of a light-emitting element is reduced, and even when a high frequency signal is used as a drive signal of the light-emitting element, loss of the drive signal is reduced, and is to provide a quantum interference apparatus, an atomic oscillator, an electronic apparatus and a moving object, which includes the light-emitting element module and has excellent reliability.

The invention can be implemented as following forms or application examples.

Application Example 1

A light-emitting element module according to this application example includes a temperature adjustment part having a temperature adjustment surface to be temperature-adjusted, a light-emitting element arranged on the temperature adjustment surface, a metal layer arranged on the temperature adjustment surface, a relay member arranged on the temperature adjustment surface through the metal layer, a wiring layer arranged on a surface of the relay member at an opposite side to the temperature adjustment surface, an element side wiring to electrically connect the light-emitting element and the wiring layer, an external terminal, and a terminal side wiring to electrically connect the external terminal and the wiring layer, and the wiring layer has an area smaller than an area of a region where the metal layer overlaps the relay member in a plan view seen from a direction in which the metal layer and the wiring layer are arranged.

According to the light-emitting element module, since the wiring layer on the relay member which is temperature-adjusted by the temperature adjustment surface exists at a halfway part (between the element side wiring and the terminal side wiring) of the wiring to electrically connect the light-emitting element and the external terminal, the temperature variation of the wiring is reduced, and accordingly, the temperature variation of the light-emitting element can also be reduced.

Further, since the area of the wiring layer is made smaller than the area of the region where the relay member overlaps the metal layer, the electrostatic capacitance between the wiring layer and the metal layer is reduced. Thus, even when a high frequency signal is used as a drive signal supplied to the light-emitting element, loss of the drive signal can be reduced. Besides, the mountability of the relay member can be secured.

Application Example 2

In the light-emitting element module, it is preferable that the temperature adjustment part is a Peltier element, and the temperature adjustment surface is a heat generation surface or a heat absorption surface of the Peltier element.

With this configuration, the light-emitting element can be appropriately temperature-adjusted. Besides, in general, the heat generation surface or the heat absorption surface of the Peltier element is made of a metal layer, and when the relay member on which the wiring layer is provided is arranged on the heat generation surface or the heat absorption surface, the electrostatic capacitance is generated between the wiring layer and the heat generation surface or the heat absorption surface.

Application Example 3

In the light-emitting element module, it is preferable that at least one of the element side wiring and the terminal side wiring is a wire wiring.

With this configuration, while formation of the wiring is made relatively simple by wire bonding, the area required for connection with the wiring of the wiring layer can be made relatively small. Thus, the area of the wiring layer can be reduced.

Application Example 4

In the light-emitting element module, it is preferable that a plurality of the terminal side wirings are provided.

With this configuration, the electric resistance of the terminal side wiring is reduced, and the loss of the drive signal supplied to the light-emitting element can be reduced.

Application Example 5

In the light-emitting element module, it is preferable that the wiring layer includes a first end part to which the element side wiring is connected and a second end part to which the terminal side wiring is connected, and extends along a direction in which the first end part and the second end part are arranged.

With this configuration, while the area of the wiring layer is reduced, the area required for connection with the wiring of the wiring layer can be secured.

Application Example 6

In the light-emitting element module, it is preferable that a width of the second end part is larger than a width of the first end part.

With this configuration, while the area of the wiring layer is reduced, the plurality of the terminal side wirings can be connected to the second end part of the wiring layer.

Application Example 7

In the light-emitting element module, it is preferable that the wiring layer includes a portion whose width is continuously reduced from the second end part side to the first end part side.

With this configuration, the loss of the high frequency drive signal supplied to the light-emitting element in the wiring layer can be reduced.

Application Example 8

In the light-emitting element module, it is preferable that the relay member includes a ceramic material.

With this configuration, insulation properties of the relay member can be secured. Besides, heat capacity of the relay member can be made relatively large, and as a result, the temperature variation of the wiring layer and the element side wiring can be reduced. Besides, since the ceramic excellent in heat conductivity is used, the temperature adjustment of the wiring layer can be efficiently performed.

Application Example 9

In the light-emitting element module, it is preferable that the wiring layer includes a surface layer including gold and an underlayer provided between the surface layer and the relay member.

With this configuration, adhesion between the wiring layer and the element side wiring formed by the wire bonding and the terminal side wiring, and adhesion between the wiring layer and the relay member can be made excellent.

Application Example 10

In the light-emitting element module, it is preferable that the underlayer includes a first layer including titanium and a second layer including palladium, which are laminated on the relay member in this order.

By this, the adhesion between the wiring layer and the relay member can be made excellent.

Application Example 11

It is preferable that the light-emitting element module includes a temperature detection element arranged on the temperature adjustment surface, a relay member for the temperature detection element arranged on the temperature adjustment surface through the metal layer, a wiring layer for the temperature detection element arranged on a surface of the relay member for the temperature detection element at an opposite side to the temperature adjustment surface, a temperature detection element side wiring to electrically connect the temperature detection element and the wiring layer for the temperature detection element, an external terminal for the temperature detection element, and a terminal side wiring for the temperature detection element to electrically connect the external terminal for the temperature detection element and the wiring layer for the temperature detection element.

With this configuration, the wiring layer for the temperature detection element on the relay member for the temperature detection element, which is temperature-adjusted by the temperature adjustment surface, exists at the halfway part of the wiring to electrically connect the temperature detection element and the external terminal for the temperature detection element. Thus, the temperature variation of the wiring is reduced, and accordingly, the temperature variation of the temperature detection element can also be reduced.

Application Example 12

A quantum interference apparatus according to this application example includes the light-emitting element module according to the application example of the invention.

With this configuration, the quantum interference apparatus having excellent reliability can be provided.

Application Example 13

An atomic oscillator according to this application example includes the light-emitting element module according to the application example of the invention.

With this configuration, the atomic oscillator having excellent reliability can be provided.

Application Example 14

An electronic apparatus according to this application example includes the light-emitting element module according to the application example of the invention.

With this configuration, the electronic apparatus having excellent reliability can be provided.

Application Example 15

A moving object according to this application example includes the light-emitting element module according to the application example of the invention.

With this configuration, the moving object having excellent reliability can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a light-emitting element module, a quantum interference apparatus, an atomic oscillator, an electronic apparatus and a moving object according to the invention will be described in detail on the basis of embodiments shown in the attached drawings.

1. Atomic Oscillator (Quantum Interference Apparatus)

First, an atomic oscillator according to the invention (atomic oscillator including a quantum interference apparatus according to the invention) will be described. Incidentally, in the following, although a description will be made on an example in which the quantum interference apparatus according to the invention is applied to the atomic oscillator, no limitation is made to this, and the quantum interference apparatus according to the invention can also be applied to, for example, a magnetic sensor, a quantum memory or the like device in addition to the atomic oscillator.

Figure 1:
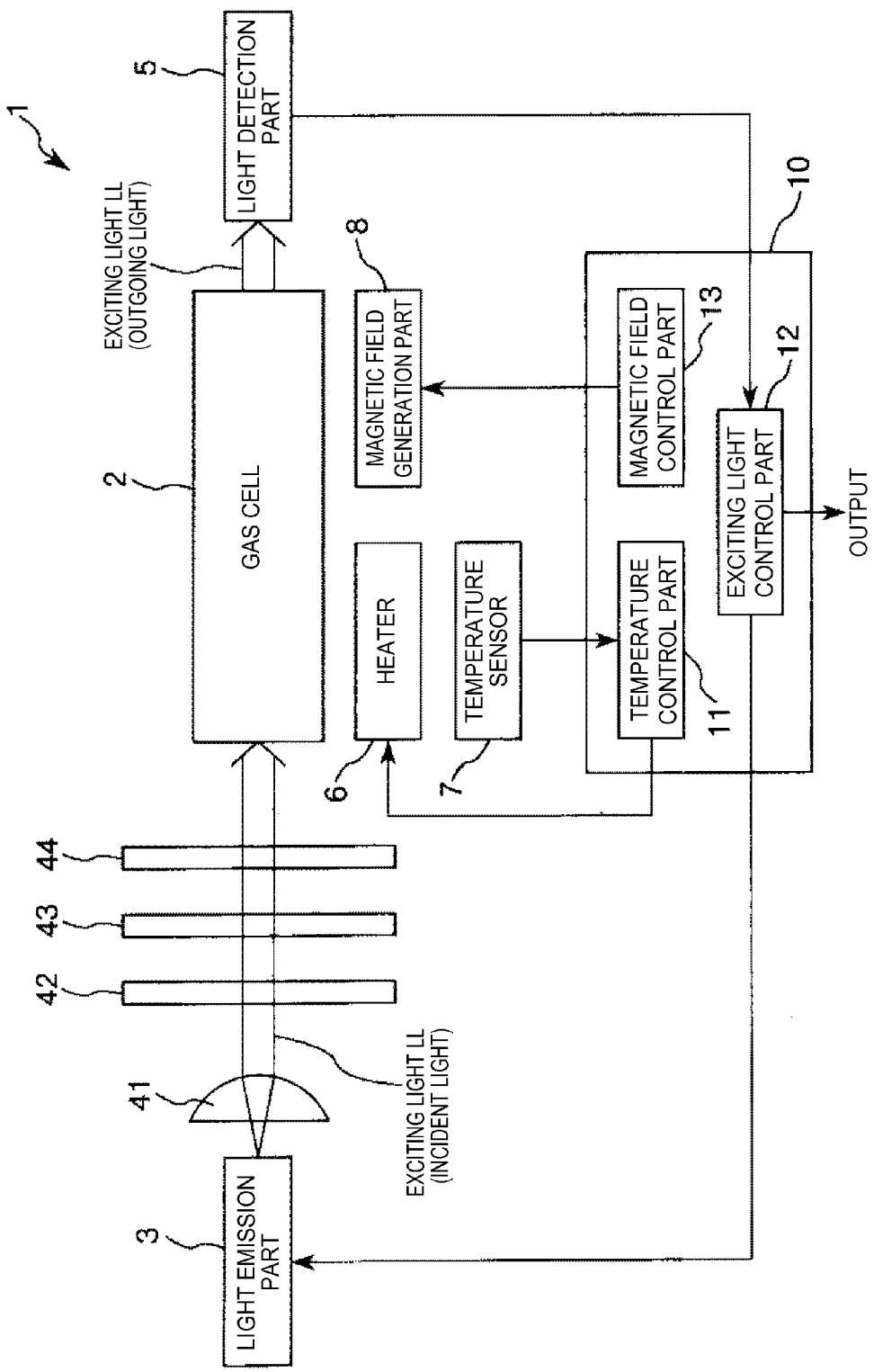
FIG. 1 is a schematic view showing an atomic oscillator (quantum interference apparatus) of an embodiment of the invention.
Figure 2:
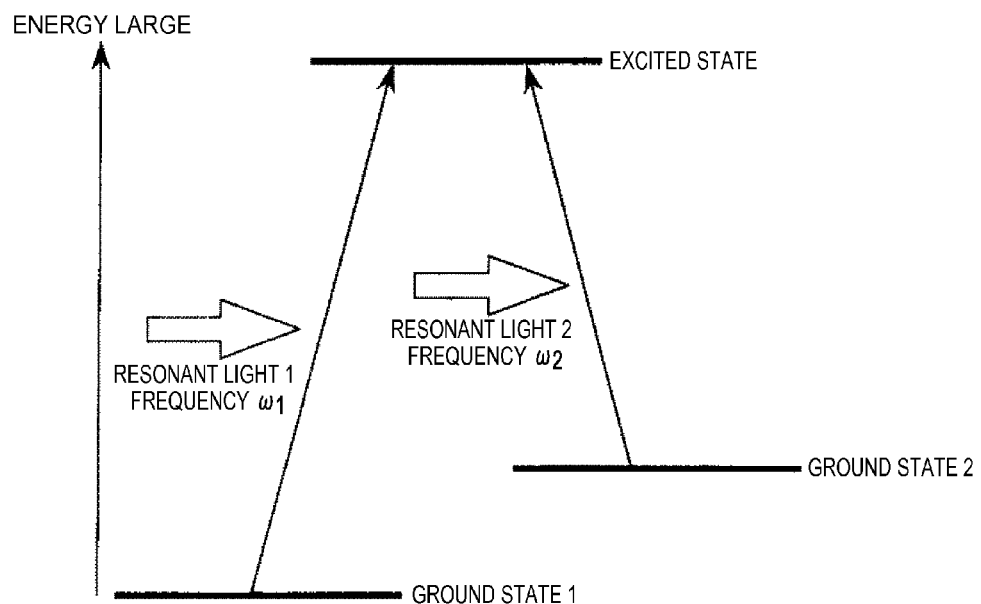
FIG. 2 is a view for explaining an energy state of an alkali metal.
Figure 3:
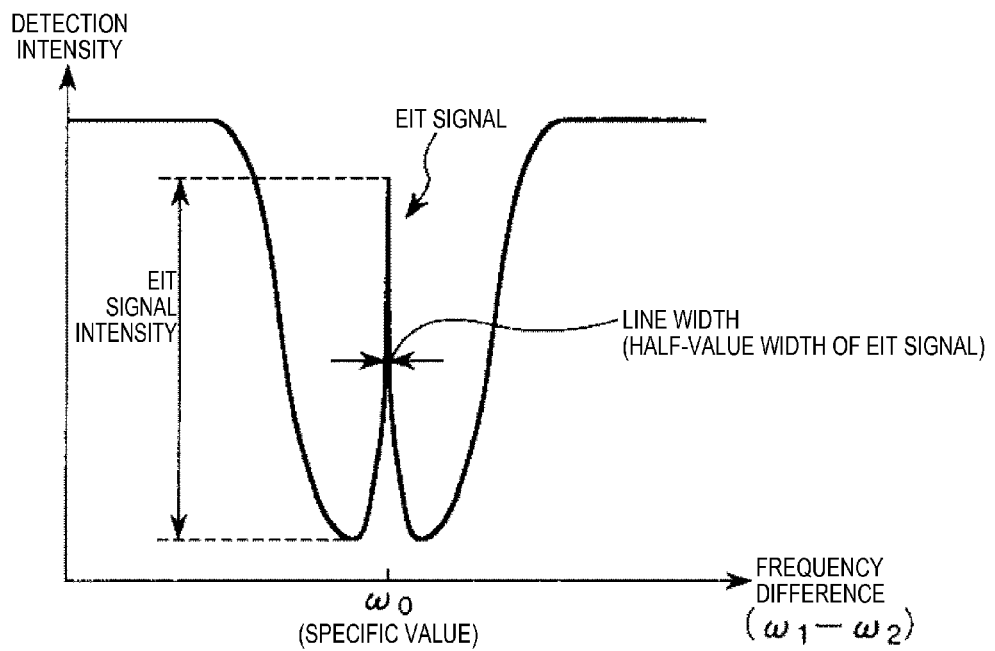
FIG. 3 is a graph showing a relation between frequency difference of two lights emitted from a light emission part and intensity of light detected by a light detection part.

FIG. 1 is a schematic view showing the atomic oscillator (quantum interference apparatus) of the embodiment of the invention. FIG. 2 is a view for explaining an energy state of an alkali metal. FIG. 3 is a graph showing a relation between frequency difference of two lights emitted from a light emission part and intensity of light detected by a light detection part.

The atomic oscillator 1 shown in FIG. 1 is an atomic oscillator using a quantum interference effect.

As shown in FIG. 1, the atomic oscillator 1 includes a gas cell 2, a light emission part 3 (light-emitting element module), optical parts 41, 42, 43 and 44, a light detection part 5, a heater 6, a temperature sensor 7, a magnetic field generation part 8 and a control part 10.

First, the principle of the atomic oscillator 1 will be briefly described.

As shown in FIG. 1, in the atomic oscillator 1, the light emission part 3 emits an exciting light LL to the gas cell 2, and the light detection part 5 detects the exciting light LL passing through the gas cell 2.

A gaseous alkali metal (metal atom) is sealed in the gas cell 2. As shown in FIG. 2, the alkali metal has three-level system energy levels, and can have three states, that is, two ground states (ground states 1 and 2) different in energy level and an excited state. Here, the ground state 1 is an energy state lower than the ground state 2.

The exciting light LL emitted from the light emission part 3 includes two kinds of resonant lights 1 and 2 different in frequency. When the two kinds of resonant lights 1 and 2 are irradiated to the gaseous alkali metal, the absorption (light transmittance) of the resonant lights 1 and 2 in the alkali metal is changed according to a difference (ω1−ω2) between a frequency ω1 of the resonant light 1 and a frequency ω2 of the resonant light 2.

When the difference (ω1−ω2) between the frequency ω1 of the resonant light 1 and the frequency ω2 of the resonant light 2 coincides with a frequency ω0 corresponding to the energy difference between the ground state 1 and the ground state 2, excitations from the ground states 1 and 2 to the excited state are respectively stopped. At this time, the resonant lights 1 and 2 are not absorbed by the alkali metal and passes through. The phenomenon as stated above is called a CPT phenomenon or an EIT (Electromagnetically Induced Transparency) phenomenon.

For example, in the light emission part 3, when the frequency ω1 of the resonant light 1 is fixed and the frequency ω2 of the resonant light 2 is changed, and when the difference (ω1−ω2) between the frequency ω1 of the resonant light 1 and the frequency ω2 of the resonant light 2 coincides with the frequency ω0 corresponding to the energy difference between the ground state 1 and the ground state 2, the detection intensity of the light detection part 5 is abruptly increased as shown in FIG. 3. Such abrupt signal is detected as an EIT signal. The EIT signal has an intrinsic value determined according to the kind of the alkali metal. Accordingly, by using the EIT signal, an oscillator having a frequency characteristic stable for a long period can be constructed.

Hereinafter, the respective parts of the atomic oscillator will be sequentially described.

Gas Cell

The gaseous alkali metal is sealed in the gas cell 2. Besides, a buffer gas, together with the alkali metal gas, is sealed in the gas cell 2. Besides, if necessary, a noble gas of argon, neon or the like, or an insert gas of nitrogen or the like, together with the alkali metal gas, is sealed as the buffer gas in the gas cell 2.

For example, although not shown, the gas cell 2 includes a main body part having a columnar through-hole, and a pair of window parts to close both openings of the through-hole. By this, an inner space where the alkali metal is sealed is formed.

A material constituting the main body part is not particularly limited, and a metal material, a resin material, a glass material, a silicon material, crystal and the like are enumerated. However, from the viewpoint of workability and bonding to the window part, the glass material or the silicon material is preferably used.

The window parts are airtightly bonded to the main body part. By this, the inner space of the gas cell 2 can be made an airtight space.

A bonding method of the main body part and the window parts is determined according to the constituent material and is not particularly limited. For example, a bonding method using an adhesive, a direct bonding method, an anodic bonding method or the like can be used.

Besides, a material constituting the window parts is not particularly limited as long as the material has transparency to the foregoing exciting light LL. For example, a silicon material, a glass material, crystal and the like are enumerated.

Light Emission Part

The light emission part 3 (light-emitting element module) has a function to emit the exciting light LL to excite the alkali metal atom in the gas cell 2.

More specifically, the light emission part 3 emits, as the exciting light LL, two kinds of lights (resonant light 1 and resonant light 2) different in frequency.

The resonant light 1 can excite (resonate) the alkali metal in the gas cell 2 from the ground state 1 to the excited state. On the other hand, the resonant light 2 can excite (resonate) the alkali metal in the gas cell 2 from the ground state 2 to the excited state.

The light emission part 3 includes a light-emitting element, for example, a semiconductor laser such as a vertical cavity surface emitting laser (VCSEL), and is formed into a module. The structure of the light emission part 3 will be described later in detail.

Optical Parts

The plural optical parts 41, 42, 43 and 44 are respectively provided on the light path of the exciting light LL between the light emission part 3 and the gas cell 2.

Here, the optical part 41, the optical part 42, the optical part 43 and the optical part 44 are arranged in this order from the light emission part 3 side to the gas cell 2 side.

The optical part 41 is a lens. By this, the exciting light LL can be efficiently irradiated to the gas cell 2.

Besides, the optical part 41 has a function to parallelize the exciting light LL. This can simply and certainly prevent the exciting light LL from being reflected by an inner wall of the gas cell 2. Thus, the resonance of the exciting light in the gas cell 2 is appropriately generated, and as a result, the oscillation characteristic of the atomic oscillator 1 can be improved.

The optical part 42 is a polarization plate. By this, the polarization of the exciting light LL from the light emission part 3 can be adjusted in a specified direction.

The optical part 43 is a neutral density filter (ND filter). By this, the intensity of the exciting light LL incident on the gas cell 2 can be adjusted (reduced). Thus, even when the output of the light emission part 3 is large, the exciting light incident on the gas cell 2 can be made to have a desired light amount. In this embodiment, the optical part 43 adjusts the intensity of the exciting light LL passing through the optical part 42 and having the polarization of the specified direction.

The optical part 44 is a $\lambda/4$ wavelength plate. By this, the exciting light LL from the light emission part 3 can be converted from linear polarization into circular polarization (right circular polarization or left circular polarization).

As described later, if the exciting light of the linear polarization is irradiated to the alkali metal atom in the state where energy levels of the alkali metal atom in the gas cell 2 are Zeeman-split by the magnetic field of the magnetic field generation part 8, the alkali metal atoms are uniformly dispersed and exist at plural levels after Zeeman splitting by interaction between the exciting light and the alkali metal atom. As a result, the number of alkali metal atoms at the desired energy level becomes relatively smaller than the number of alkali metal atoms at the other energy levels. Thus, the number of atoms generating the desired EIT phenomenon is reduced, and the intensity of the desired EIT signal is reduced. As a result, the oscillation characteristic of the atomic oscillator 1 is reduced.

On the other hand, as described later, when the exciting light of the circular polarization is irradiated to the alkali metal atom in the state where energy levels of the alkali metal atom in the gas cell 2 are Zeeman-split by the magnetic field of the magnetic field generation part 8, the number of alkali metal atoms at the desired energy level among plural levels after Zeeman splitting of the alkali metal atoms can be made relatively larger than the number of alkali metal atoms at the other energy levels by interaction between the exciting light and the alkali metal atom. Thus, the number of atoms generating the desired EIT phenomenon is increased, and the intensity of the desired EIT signal is increased. As a result, the oscillation characteristic of the atomic oscillator 1 can be improved.

Light Detection Part

The light detection part 5 has a function to detect the intensity of the exciting light LL (resonant lights 1 and 2) passing through the gas cell 2.

Although the light detection part 5 is not particularly limited as long as the exciting light as described above can be detected, for example, a light detector (light receiving element) such as a solar cell or a photodiode can be used.

Heater

The heater 6 (heating part) has a function to heat the gas cell 2 (more specifically, the alkali metal in the gas cell 2). By this, the alkali metal in the gas cell 2 can be kept to be a gaseous state with suitable concentration.

This heater 6 generates heat by energization (direct current), and includes, for example, a heat generating resistor.

Besides, the heater 6 may be in non-contact with the gas cell 2 as long as the gas cell 2 can be heated. In this case, the heater is arranged to be connected to the gas cell 2 through a member having excellent heat conductivity (for example, a member made of metal). Besides, instead of the heater 6 or in addition to the heater 6, a Peltier element may be used to heat the gas cell 2.

Temperature Sensor

The temperature sensor 7 detects the temperature of the heater 6 or the gas cell 2. The amount of heat generation of the heater 6 is controlled based on the detection result of the temperature sensor 7. By this, the alkali metal in the gas cell 2 can be kept at a desired temperature.

The installation position of the temperature sensor 7 is not particularly limited, and may be, for example, above the heater 6 or may be above the outer surface of the gas cell 2.

The temperature sensor 7 is not particularly limited, and various well-known temperature sensors such as a thermistor and a thermocouple can be used.

Magnetic Field Generation Part

The magnetic field generation part 8 has a function to generate a magnetic field which Zeeman-splits plural degenerated energy levels of the alkali metal in the gas cell 2. By this, the gap between the different degenerated energy levels of the alkali metal is expanded by Zeeman splitting, and the resolution can be improved. As a result, accuracy of the oscillation frequency of the atomic oscillator 1 can be raised.

The magnetic field generation part 8 is constructed of, for example, a Helmholtz coil arranged so as to sandwich the gas cell 2, or a solenoid coil arranged so to cover the gas cell 2. By this, the uniform magnetic field in one direction can be generated in the gas cell 2.

Besides, although the magnetic field generated by the magnetic field generation part 8 is a constant magnetic field (direct-current magnetic field), an alternating-current magnetic field may be superimposed.

Control Part

The control part 10 has a function to control the light emission part 3, the heater 6 and the magnetic field generation part 8.

The control part 10 includes an exciting light control part 12 to control the frequencies of the resonant lights 1 and 2 of the light emission part 3, a temperature control part 11 to control the temperature of the alkali metal in the gas cell 2, and a magnetic field control part 13 to control the magnetic field of the magnetic field generation part 8.

The exciting light control part 12 controls the frequencies of the resonant lights 1 and 2 emitted from the light emission part 3 based on the detection result of the light detection part 5. More specifically, the exciting light control part 12 controls the frequencies of the resonant lights 1 and 2 emitted from the light emission part 3 so that the frequency difference (ω1−ω2) becomes the frequency ω0 intrinsic to the alkali metal.

Here, although not shown, the exciting light control part 12 includes a voltage controlled crystal oscillator (oscillation circuit), and while synchronizing and adjusting the oscillation frequency of the voltage controlled crystal oscillator based on the detection result of the light detection part 5, the exciting light control part outputs an output signal of the voltage controlled crystal oscillator as an output signal of the atomic oscillator 1.

Besides, although not shown, the exciting light control part 12 includes a multiplier to frequency-multiply the output signal from the voltage controlled crystal oscillator, superimposes the signal (high frequency signal) multiplied by the multiplier onto a direct-current bias current to form a drive signal, and inputs the signal into the light emission part 3. By this, the voltage controlled crystal oscillator is controlled so that the EIT signal is detected by the light detection part 5, and the EIT signal of a desired frequency is outputted from the voltage controlled crystal oscillator. For example, when the desired frequency of the output signal from the atomic oscillator 1 is f, the multiplication rate of the multiplier is ω0/(2×f). By this, when the oscillation frequency of the voltage controlled crystal oscillator is f, the light-emitting element such as a semiconductor laser is modulated by using the signal from the multiplier, and the two lights in which the frequency difference (ω1−ω2) is ω0 can be emitted.

The temperature control part 11 controls energization to the heater 6 based on the detection result of the temperature sensor 7. By this, the gas cell 2 can be kept within a desired temperature range (for example, about 70° C.).

The magnetic field control part 13 controls energization to the magnetic field generation part 8 so that the magnetic field generated by the magnetic field generation part 8 becomes constant.

The control part 10 as stated above is provided in, for example, an IC chip mounted on a board.

Although the whole structure of the atomic oscillator 1 has been briefly described, in the atomic oscillator 1, the light-emitting element of the light emission part 3 is required to be temperature-adjusted at high precision in order to reduce the change of the light emission state. Besides, as described above, although the high frequency signal is used as the drive signal of the light-emitting element included in the light emission part 3, the loss of the drive signal is also required to be reduced.

Then, the light emission part 3 has a structure in which the light-emitting element is temperature-adjusted at high precision, and the loss of the drive signal of the light-emitting element is reduced. Hereinafter, the light emission part 3 will be described in detail.

Detail Description of the Light Emission Part (Light-Emitting Element Module)

Figure 4:
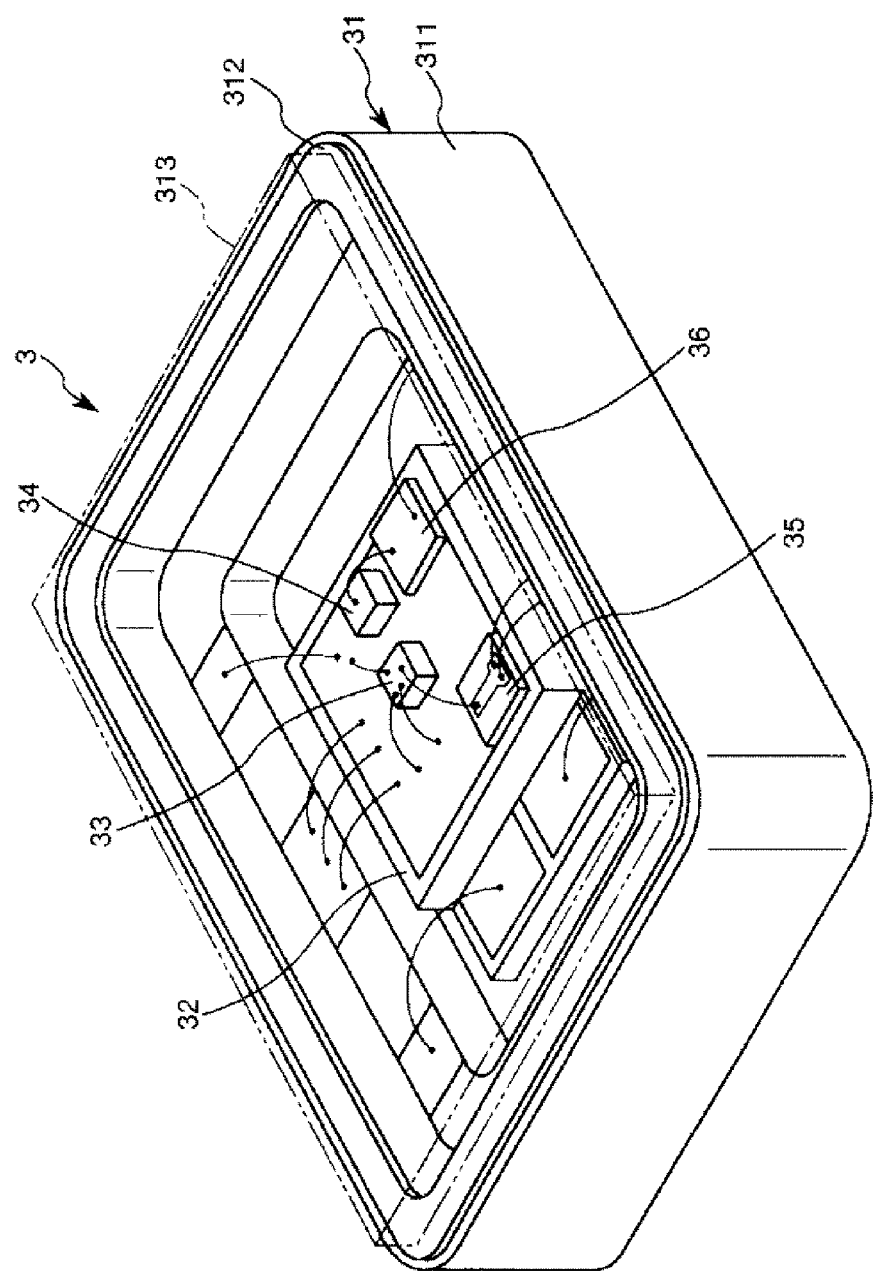
FIG. 4 is a perspective view of a light emission part (light-emitting element module) included in the atomic oscillator shown in FIG. 1.
Figure 5:
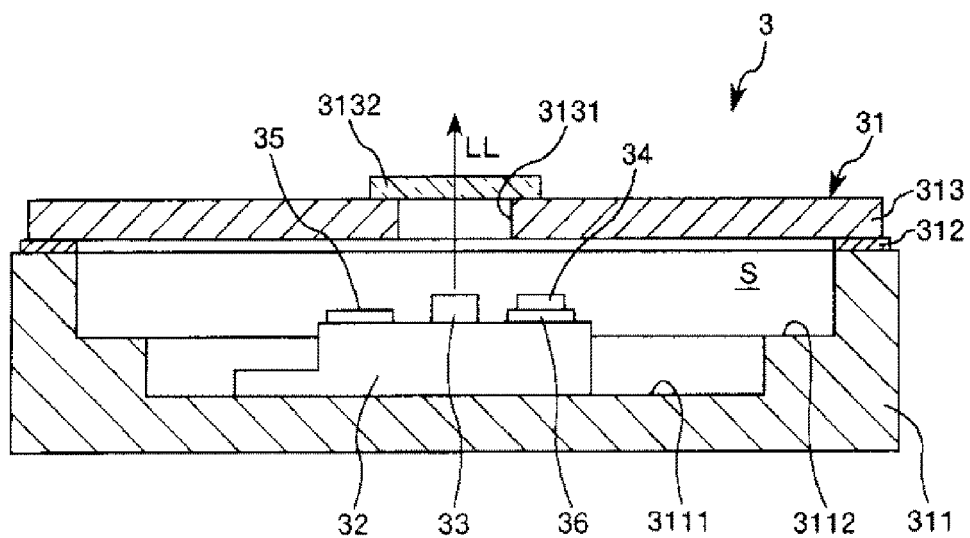
FIG. 5 is a sectional view of the light emission part shown in FIG. 4.
Figure 6:
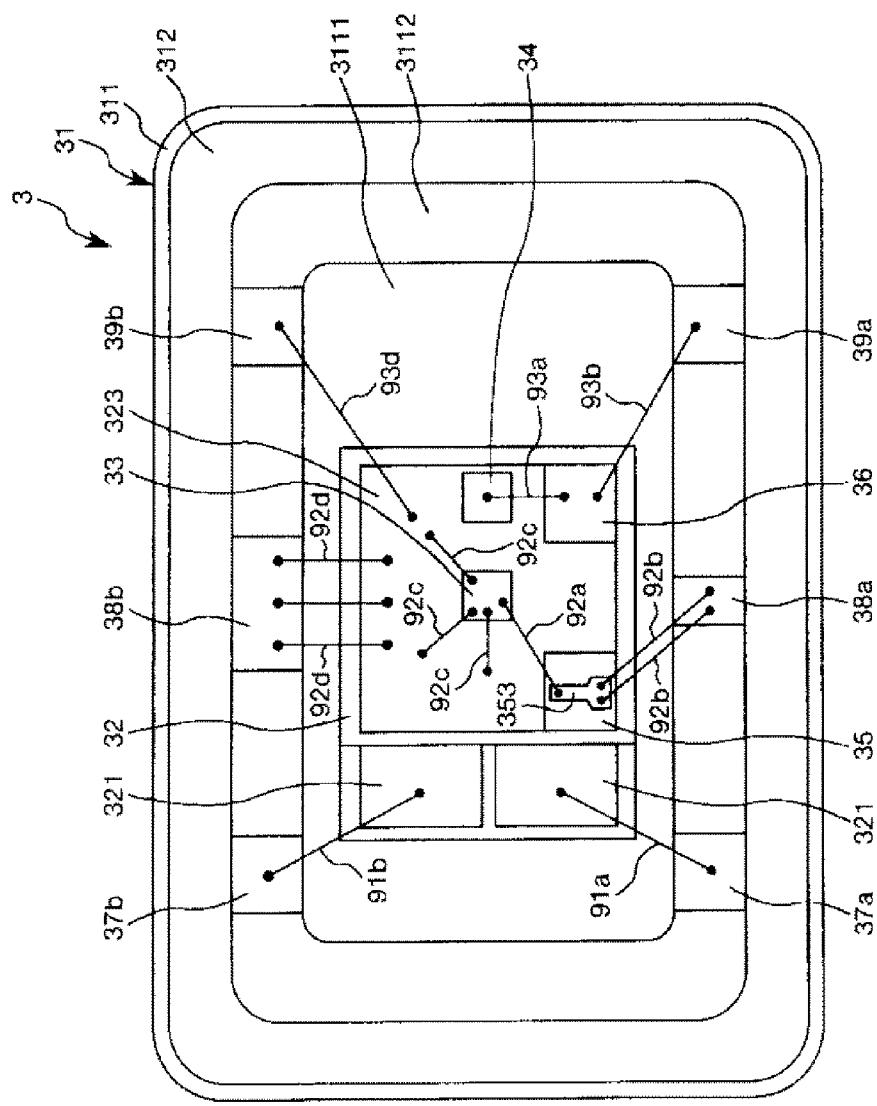
FIG. 6 is a plan view of the light emission part shown in FIG. 4.
Figure 7:
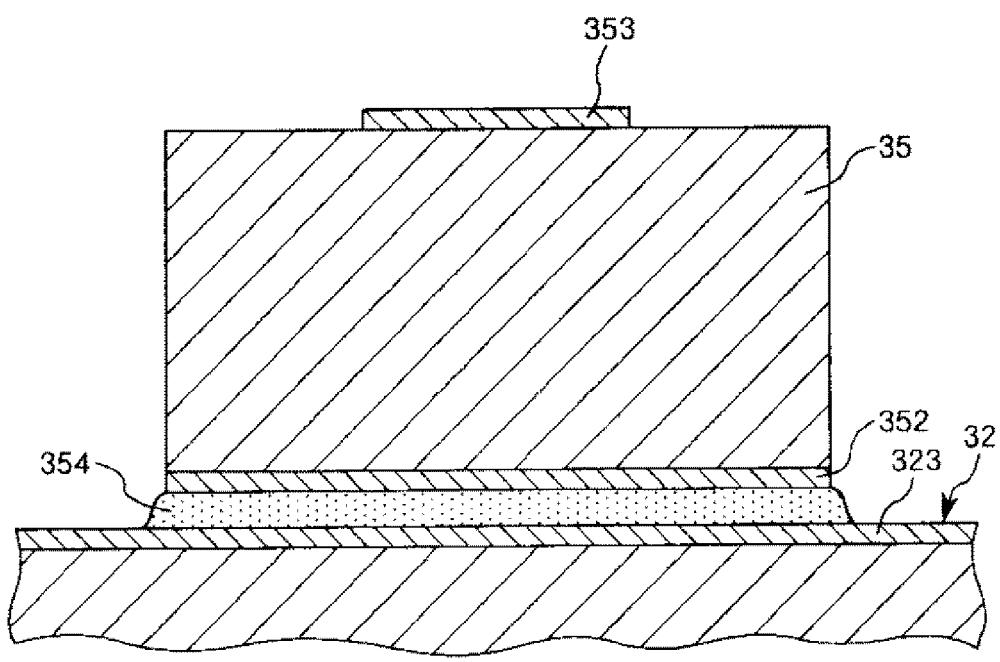
FIG. 7 is a sectional view of a relay member of the light emission part shown in FIG. 4.
Figure 8A:
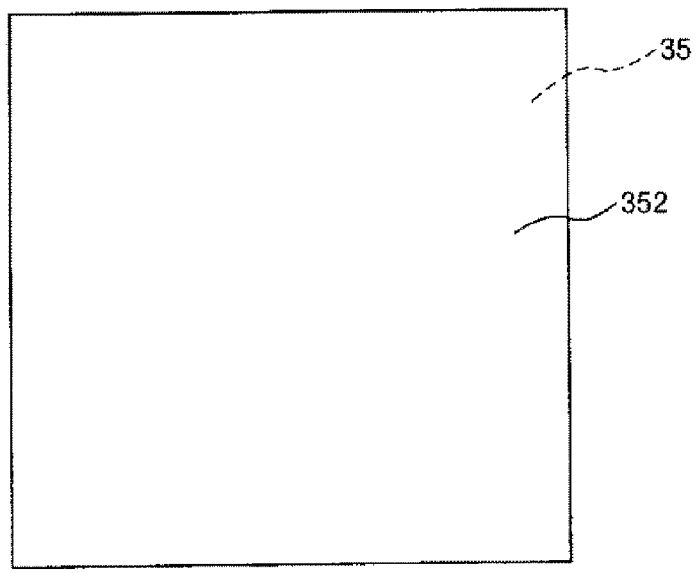
FIG. 8A is a back surface view of the relay member shown in FIG. 7.
Figure 8B:
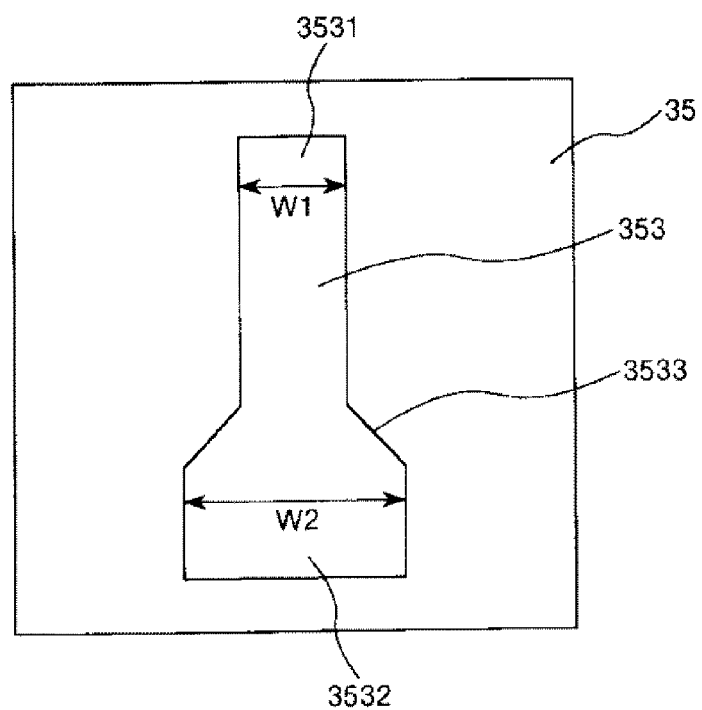
FIG. 8B is a front surface view of the relay member shown in FIG. 7.

FIG. 4 is a perspective view of the light emission part (light-emitting element module) included in the atomic oscillator shown in FIG. 1, FIG. 5 is a sectional view of the light emission part shown in FIG. 4, and FIG. 6 is a plan view of the light emission part shown in FIG. 4. FIG. 7 is a sectional view of a relay member of the light emission part shown in FIG. 4, FIG. 8A is a back surface view of the relay member shown in FIG. 7, and FIG. 8B is a front surface view of the relay member shown in FIG. 7. Incidentally, in the following, for convenience of description, an upper side in FIG. 5 is called "upper", and a lower side is called "lower".

As shown in FIG. 4, the light emission part 3 includes a package 31, a temperature adjustment element 32 (temperature adjustment part) housed in the package 31, a light-emitting element 33, a temperature detection element 34 and relay members 35 and 36.

As shown in FIG. 5, the package 31 includes a base 311 having a concave part 3111 opening at an upper surface, and a lid 313 to close the opening of the concave part 3111. By this, the inside of the concave part 3111 closed by the lid 313 functions as a housing space S to house the temperature adjustment element 32, the light-emitting element 33, the temperature detection element 34 and the relay members 35 and 36. The housing space S is preferably in a reduced pressure (vacuum) state. This reduces an influence given by the external temperature variation of the package 31 to the light-emitting element 33, the temperature detection element 34 and the like in the package 31, and the temperature variation of the light-emitting element 33, the temperature detection element 34 and the like in the package 31 can be reduced. Incidentally, the inside of the package 31 may not be in the reduced pressure state, and an inert gas such as nitrogen, helium or argon may be sealed.

Although a constituent material of the base 311 is not particularly limited, a material having insulation properties and suitable for bringing the housing space S into an airtight space, for example, various ceramics including oxide ceramic such as alumina, silica, titania or zirconia, nitride ceramic such as silicon nitride, aluminum nitride or titanium nitride, and carbon ceramic such as silicon carbide can be used. Incidentally, the same metal material as the lid 313 can also be used as the constituent material of the base 311.

Besides, the base 311 includes a step part 3112 formed at a position higher than the bottom surface of the concave part 3111.

As shown in FIG. 6, the step part 3112 is provided with a pair of connection electrodes 37a and 37b electrically connected to the temperature adjustment element 32, a pair of connection electrodes 38a and 38b electrically connected to the light-emitting element 33, and a pair of connection electrodes 39a and 39b electrically connected to the temperature detection element 34. Although not shown, the connection electrodes 37a, 37b, 38a, 38b, 39a and 39b (external terminals) are respectively electrically connected to external mount electrodes provided on a lower surface of the base 311 through through-electrodes.

Constituent materials of the connection electrodes 37a, 37b, 38a, 38b, 39a and 39b, the external mount electrodes and the through-electrodes are not particularly limited, and a metal material, for example, gold (Au), gold alloy, platinum (Pt), aluminum (Al), aluminum alloy, silver (Ag), silver alloy, chromium (Cr), chromium alloy, nickel (Ni), copper (Cu), molybdenum (Mo), niobium (Nb), tungsten (W), iron (Fe), titanium (Ti), cobalt (Co), zinc (Zn), zirconium (Zr), etc. can be used.

Besides, a frame-like metalize layer 312 is provided on an upper end surface of the base 311. The metalize layer 312 is for raising adhesion with brazing material. By this, the bonding intensity between the base 311 and the lid 313 through the brazing material can be raised.

The constituent material of the metalize layer 312 is not particularly limited as long as the material can raise the adhesion with the brazing material. For example, metal materials enumerated as the constituent materials of the connection electrodes 37a, 37b, 38a, 38b, 39a and 39b can be used.

As shown in FIG. 5, the lid 313 has a flat plate shape. Besides, the lid 313 is provided with a through-hole 3131. The through-hole 3131 is closed by a window member 3132 having transparency to the exciting light LL.

The lid 313 is bonded to the base 311 by welding to the metalize layer 312 using the brazing material. The brazing material is not particularly limited, and for example, a gold brazing material, a silver brazing material or the like can be used.

Besides, the constituent material of the lid 313 (portion other than the window member 3132) is not particularly limited, and metal materials are preferably used. Among them, a metal material having a linear expansion coefficient close to that of the constituent material of the base 311 is preferably used. Accordingly, for example, when the base 311 is a ceramic board, an alloy such as kovar is preferably used as the constituent material of the lid 313.

Besides, the window member 3132 is arranged on the light path of the light emitted from the light-emitting element 33. In this embodiment, the window member 3132 has a plate shape. Incidentally, the window member 3132 is not limited to the plate shape, and may have, for example, a curved surface so as to function as a lens.

Besides, as the constituent material of the window member 3132, for example, a glass material can be used.

The temperature adjustment element 32 is arranged on the bottom surface of the concave part 3111 of the base 311 of the package 31. The temperature adjustment element 32 is fixed to the base 311 by, for example, an adhesive.

The temperature adjustment element 32 has a function to adjust the temperature of the light-emitting element 33, the temperature detection element 34 and the relay members 35 and 36.

In this embodiment, the temperature adjustment member 32 is a Peltier element. The temperature adjustment element 32 has a pair of surfaces, one of which is a heat generation side surface (heat generation surface) and the other of which is a heat absorption side surface (heat absorption surface). One surface (lower surface) of the pair of surfaces is fixed to the base 311 of the package 31, and the other surface (upper surface) is an installation surface on which the light-emitting element 33, the temperature detection element 34 and the relay members 35 and 36 are installed and constitutes a "temperature adjustment surface" to be temperature-adjusted. By this, the light-emitting element 33 can be appropriately temperature-adjusted.

The temperature adjustment element 32 as the Peltier element can switch the installation surface of the temperature adjustment element 32 between the heat generation surface and the heat absorption surface by controlling the direction of supplied current. Thus, even if the range of environmental temperature is wide, the light-emitting element 33 and the like can be temperature-adjusted to a desired temperature. Here, the temperature of the temperature adjustment surface is determined according to the characteristic of the light-emitting element 33, and is, for example, about 30° C. although the temperature is not particularly limited.

Incidentally, the temperature adjustment element 32 is not limited to the Peltier element, and may be, for example, a heat generating resistor (heater).

Besides, the temperature adjustment element 32 includes a pair of terminals 321, and the pair of terminals 321 are electrically connected to the connection electrodes 37a and 37b provided on the package 31 through wirings 91a and 91b. By this, electric power is supplied to the pair of terminals 321, and the temperature adjustment element 32 can be driven. Each of the wirings 91a and 91b is a wire wiring (bonding wire).

Besides, the temperature adjustment element 32 is driven and controlled based on the detection temperature of the temperature detection element 34.

A metal layer 323 made of a metal excellent in heat conductivity, such as aluminum, gold or silver, is arranged on the upper surface (temperature adjustment surface) of the temperature adjustment element 32. The light-emitting element 33, the temperature detection element 34 and the relay members 35 and 36 are arranged on an upper surface of the metal layer 323. By this, the temperature adjustment element 32 can temperature-adjust the light-emitting element 33, the temperature detection element 34 and the relay members 35 and 36.

The light-emitting element 33 is a semiconductor laser such as, for example, a vertical cavity surface emitting laser (VCSEL). The semiconductor laser can emit two kinds of lights different in wavelength by superimposing a high frequency signal on a direct-current bias current (by modulating).

Besides, the light-emitting element 33 includes a not-shown pair of terminals. One of the pair of terminals is a terminal for a drive signal, and the other is a ground terminal. The terminal for the drive signal is electrically connected to the connection electrode 38a provided on the package 31 through a wiring 92a (element side wiring), a wiring layer 353 provided on the relay member 35 (relay member for the light-emitting element) and a wiring 92b (terminal side wiring). On the other hand, the ground terminal is electrically connected to the connection electrode 38b provided on the package 31 through a wiring 92c, the metal layer 323 and a wiring 92d.

Each of the wirings 92a, 92b, 92c and 92d is a wire wiring (bonding wire). By this, the wirings 92a, 92b, 92c and 92d are relatively easily formed by wire bonding. Particularly, an area of the wiring layer 353 necessary for connection with the wirings 92a and 92b can be made relatively small. Thus, the area of the wiring layer 353 can be reduced.

Besides, a plurality of the wirings 92b are provided. By this, the electric resistance of the wirings 92b is reduced, and the loss of the drive signal supplied to the light-emitting element 33 can be reduced. From the same viewpoint, a plurality of the wirings 92c and 92d are provided.

The light-emitting element 33 is supplied with power and can be driven by such electrical connection between the light-emitting element 33 and the connection electrodes 38a and 38b. Besides, since halfway parts of the wirings to electrically connect the light-emitting element 33 and the connection electrodes 38a and 38b are in contact with the temperature adjustment surface of the temperature adjustment element 32 or the member temperature-adjusted by this, the wirings 92a, 92b, 92c and 92d are also temperature-adjusted by the temperature adjustment element 32. Thus, the temperature variation of the wirings 92a, 92b, 92c and 92d is reduced, and accordingly, the temperature variation of the light-emitting element 33 can also be reduced.

Here, the wiring layer 353 on the relay member 35 temperature-adjusted by the temperature adjustment surface of the temperature adjustment element 32 exists at the halfway part (between the wiring 92a and the wiring 92b) of the wiring to electrically connect the light-emitting element 33 and the connection electrode 38a. Besides, the metal layer 323 temperature-adjusted by the temperature adjustment surface of the temperature adjustment element 32 exists at the halfway part (between the wiring 92*c* and the wiring 92*d*) of the wiring to electrically connect the light-emitting element 33 and the connection electrode 38*b*. By this, the wirings 92*a*, 92*b*, 92*c* and 92*d* are thermally connected to the temperature adjustment surface of the temperature adjustment element 32.

The relay member 35 has insulation properties, and a metal layer 352 is arranged on a lower surface of the relay member 35, while the wiring layer 353 is arranged on an upper surface of the relay member 35 (surface of the relay member 35 opposite to the temperature adjustment surface). Here, since the relay member 35 has insulation properties, the relay member has a function to prevent the wiring layer 353 from short-circuiting with the metal layer 323 on the temperature adjustment element 32.

Although the constituent material of the relay member 35 is not particularly limited as long as the material has insulation properties, a ceramic material is preferably used. When the relay member 35 includes the ceramic material, the insulation properties of the relay member 35 can be secured. Besides, the heat capacity of the relay member 35 can be made relatively large, and as a result, the temperature variation of the wiring layer 353 and the wirings 92*a* and 92*b* can be reduced. Besides, when the ceramic excellent in heat conductivity is used, the temperature adjustment of the wiring layer 353 can be efficiently performed.

The metal layer 352 is connected to the metal layer 323 through a bonding member 354. As the bonding member 354, for example, a brazing material such as a gold brazing material or a silver brazing material can be used.

The metal layer 352 has a function to increase adhesion and bonding strength to the bonding member 354. In this embodiment, as shown in FIG. 8A, the metal layer 352 is provided on the whole lower surface of the relay member 35. By this, the foregoing function is appropriately exerted. Incidentally, if the foregoing function can be secured to a necessary degree, the metal layer 352 may be provided only on a part of the lower surface of the relay member 35. Besides, if short-circuiting with the wiring layer 353 does not occur, the metal layer 352 may include a portion provided on a side surface of the relay member 35.

On the other hand, the wiring layer 353 is for electrically connecting the wiring 92*a* and the wiring 92*b*, and constitutes a part of the wiring to electrically connect the light-emitting element 33 and the connection electrode 38*a*.

Here, electrostatic capacity occurs between the metal layer 352 and the wiring layer 353 facing each other through the relay member 35. Accordingly, if the electrostatic capacity is large, when a high frequency signal is used as the drive signal of the light-emitting element 33, the loss of the drive signal becomes large. Besides, as described before, the heat generation surface or the heat absorption surface of the temperature adjustment element 32 as the Peltier element is made of the metal layer 323. Thus, when the relay member 35 on which the wiring layer 353 is provided is arranged on the metal layer 323, electrostatic capacitance occurs between the wiring layer 353 and the metal layer 323. Besides, electrostatic capacitance occurs also between the bonding member 354 and the wiring layer 353.

Then, as shown in FIG. 8B, the wiring layer 353 is formed on a part of the upper surface of the relay member 35. Accordingly, the wiring layer 353 has an area smaller than a region where the metal layer 323 overlaps the relay member 35 in a plan view seen from a direction in which the metal layer 352 and the wiring layer 353 are arranged (hereinafter, simply called also "plan view"). By this, the electrostatic capacity between the wiring layer 353 and the metal layer 352 is reduced. Thus, even if the high frequency signal is used as the drive signal supplied to the light-emitting element 33, the loss of the drive signal can be reduced. Besides, the size of the relay member 35 is secured to a certain degree, and as a result, the mountability of the relay member 35 can be secured.

Besides, in a plan view, the wiring layer 353 has the area smaller than a region where the metal layer 323 overlaps the relay member 35 and a region where the bonding member 354 overlaps the relay member 35. Accordingly, similarly to the portion between the wiring layer 353 and the metal layer 352, the loss of the drive signal of the light-emitting element 33 is reduced also in the portion between the wiring layer 353 and the metal layer 323 and the portion between the wiring layer 353 and the bonding member 354.

Besides, the wiring layer 353 includes a first end part 3531 and a second end part 3532, and has a longitudinal shape extending in a direction in which the first end part 3531 and the second end part 3532 are arranged. The wiring 92*a* is connected to the first end part 3531, while the wiring 92*b* is connected to the second end part 3532. According to the wiring layer 353, while the area of the wiring layer 353 is reduced, the area of the wiring layer 353 necessary for connection with the wirings 92*a* and 92*b* can be secured.

Besides, a width W2 of the second end part 3532 is larger than a width W1 of the first end part 3531. By this, while the area of the wiring layer 353 is reduced, the plural wirings 92*b* can be connected to the second end part 3532 of the wiring layer 353.

Besides, the wiring layer 353 includes a portion 3533 which is provided between the first end part 3531 and the second end part 3532 and the width of which is continuously decreased from the second end part 3532 side to the first end part 3531 side. By this, the loss of the high-frequency drive signal supplied to the light-emitting element 33 in the wiring layer 353 can be reduced.

Besides, the length of the wiring layer 353 is shorter than the length of the upper surface of the relay member 35 in the same direction. Thus, the edge part of the wiring layer 353 is separate from the edge part of the upper surface of the relay member 35. By this, the wiring layer 353 can be made hard to be peeled off from the relay member 35. Besides, non-uniformity of temperature variation and temperature distribution in the wiring layer 353 can be reduced.

As the constituent material of the wiring layer 353 and the metal layer 352, the same material as that of the connection electrodes 37*a*, 37*b*, 38*a*, 38*b*, 39*a* and 39*b* can be used. However, the wiring layer 353 preferably includes a surface layer including gold and an underlayer provided between the surface layer and the relay member 35. By this, the adhesion between the wiring layer 353 and the wirings 92*a* and 92*b* formed by wire bonding, and the adhesion between the wiring layer 353 and the relay member 35 can be made excellent.

Here, the underlayer used for the wiring layer 353 is preferably formed such that a first layer including titanium and a second layer including palladium are laminated on the relay member 35 in this order. By this, the adhesion between the wiring layer 353 and the relay member 35 can be made excellent.

On the other hand, the temperature detection element 34 has a function to detect the temperature of the temperature adjustment element 32 or the light-emitting element 33. The temperature detection element 34 is not particularly limited, and for example, a thermistor, a thermocouple or the like can be used.

Besides, the temperature detection element 34 includes a not-shown pair of terminals. One of the pair of terminals is a detection signal terminal, and the other is a ground terminal. The detection signal terminal is electrically connected to the connection electrode 39a provided on the package 31 through a wiring 93a (element side wiring for temperature detection element), a wiring layer (not shown) provided in the relay member 36 (relay member for temperature detection element), and a wiring 93b (terminal side wiring for temperature detection element). On the other hand, the ground terminal is electrically connected to the connection electrode 39b provided on the package 31 through a wiring 93c, the metal layer 323 and a wiring 93d.

Each of the wirings 93a, 93b, 93c and 93d is a wire wiring (bonding wire).

By the electrical connection between the temperature detection element 34 and the connection electrodes 39a and 39b as described above, a halfway part of the wiring to electrically connect the temperature detection element 34 and the connection electrodes 39a and 39b is in contact with the temperature adjustment surface of the temperature adjustment element 32 or the member temperature-adjusted by this. Thus, the wirings 93a, 93b, 93c and 93d are also temperature-adjusted by the temperature adjustment element 32. Thus, the temperature variation of the wirings 93a, 93b, 93c and 93d is reduced, and accordingly, the temperature variation of the temperature detection element 34 can also be reduced. That is, the temperature detection element 34 can be made hard to receive the influence of heat from the connection electrodes 39a and 39b. Thus, the detection accuracy of the temperature detection element 34 can be raised, and as a result, the temperature of the light-emitting element 33 can be controlled at high precision.

The relay member 36 can be constructed similarly to the foregoing relay member 35. However, since a high frequency signal is not used for the temperature detection element 34, the wiring layer provided on the upper surface of the relay member 36 may be provided on the whole upper surface of the relay member 36.

2. Electronic Apparatus

The atomic oscillator as described above can be assembled in various electronic apparatuses. Such electronic apparatuses have excellent reliability.

Hereinafter, an electronic apparatus according to the invention will be described.

Figure 9:
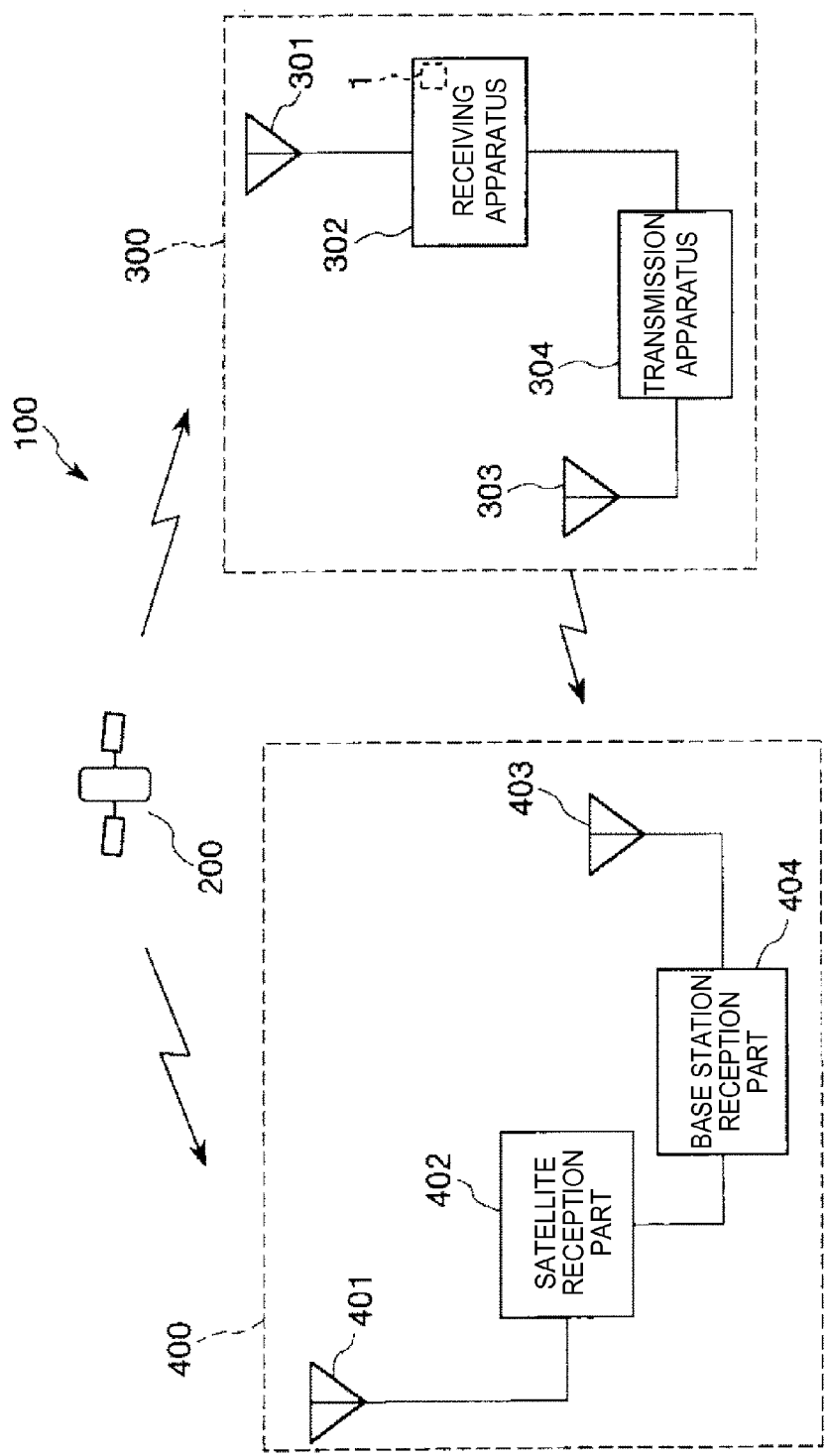
FIG. 9 is a view showing a rough structure in a case where the atomic oscillator according to the invention is used for a positioning system using a GPS satellite.

FIG. 9 is a view showing a schematic structure of a case where the atomic oscillator according to the invention is used for a positioning system using a GPS satellite.

A positioning system 100 shown in FIG. 9 includes a GPS satellite 200, a base station apparatus 300 and a GPS receiving apparatus 400.

The GPS satellite 200 transmits positioning information (GPS signal).

The base station apparatus 300 includes a receiving apparatus 302 to receive the positioning information from the GPS satellite 200 through an antenna 301 installed at, for example, an electric reference point (GPS continuous observation station) at high precision, and a transmission apparatus 304 to transmit the positioning information received by the receiving apparatus 302 through an antenna 303.

Here, the receiving apparatus 302 is an electronic apparatus including the atomic oscillator 1 according to the invention as a reference frequency oscillation source. The receiving apparatus 302 has excellent reliability. Besides, the positioning information received by the receiving apparatus 302 is transmitted by the transmission apparatus 304 in real time.

The GPS receiving apparatus 400 includes a satellite reception part 402 to receive the positioning information from the GPS satellite 200 through an antenna 401 and a base station reception part 404 to receive the positioning information from the base station apparatus 300 through an antenna 403.

3. Moving Object

Figure 10:
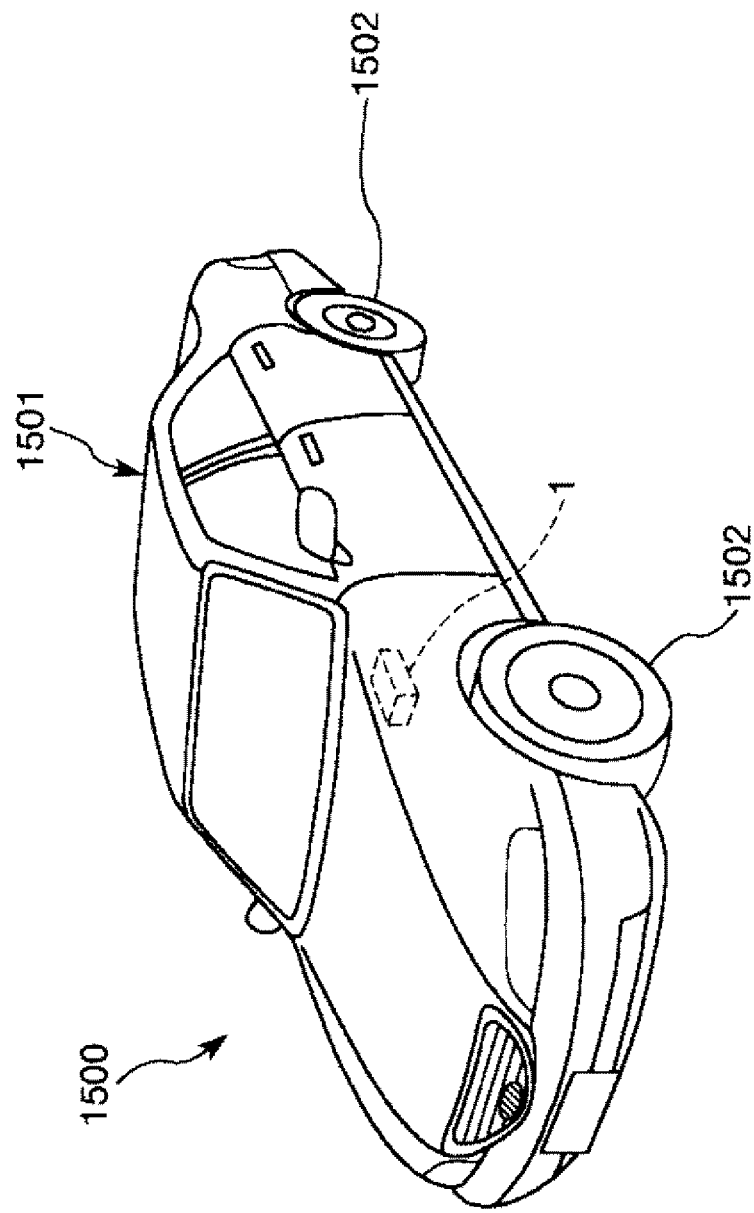
FIG. 10 is a view showing an example of a moving object according to the invention.

FIG. 10 is a view showing an example of a moving object according to the invention.

In this drawing, a moving object 1500 includes a vehicle body 1501 and four wheels 1502, and is constructed so that the wheels 1502 are rotated by a not-shown power source (engine) provided in the vehicle body 1501. The moving object 1500 includes the atomic oscillator 1.

According to the moving object, excellent reliability can be obtained.

Incidentally, the electronic apparatus including the atomic oscillator according to the invention is not limited to the foregoing, and can be applied to, for example, a cellular phone, a digital still camera, an ink jet discharge apparatus (for example, an ink jet printer), a personal computer (mobile personal computer, lap-top personal computer), a television, a video camera, a video tape recorder, a car navigation apparatus, a pager, an electronic notebook (including one with a communication function), an electronic dictionary, a calculator, an electronic game machine, a word processor, a work station, a television telephone, a television monitor for crime prevention, electronic binoculars, a POS terminal, a medical equipment (for example, electronic thermometer, blood pressure manometer, blood sugar meter, electrocardiographic apparatus, ultrasonic diagnosis apparatus, electronic endoscope), a fish finder, various measuring equipments, instruments (for example, instruments for vehicles, airplanes or ships), a flight simulator, a terrestrial digital broadcast, a cellular phone base station, and the like.

Although the light-emitting element module, the quantum interference apparatus, the atomic oscillator, the electronic apparatus and the moving object according to the invention have been described on the basis of the illustrated embodiments, the invention is not limited to these.

Besides, the respective components according to the invention can be replaced by an arbitrary component having the same function in the foregoing embodiments, and an arbitrary component can be added.

Besides, in the embodiment, the description has been made while using, as an example of the quantum interference apparatus according to the invention, the quantum interference apparatus in which the quantum interference effect caused by two kinds of lights different in wavelength is used to cause the resonant transition of cesium or the like. However, the quantum interference apparatus according to the invention is not limited to this, and can be applied also to a double resonance apparatus which causes the resonant transition of rubidium or the like by using a double resonance phenomenon caused by light and microwave.

Besides, in the foregoing embodiments, the description has been made while using, as an example, the case where the light-emitting element module according to the invention is used for the quantum interference apparatus or the atomic oscillator. However, no limitation is made to this, and the light-emitting element module can be used for any devices using a light-emitting element driven by a high frequency signal.

The entire disclosure of Japanese Patent Application No. 2013-263489, filed Dec. 20, 2013 is expressly incorporated by reference herein.

What is claimed is:

1. A light-emitting element module comprising:
   a temperature adjustment part having a temperature adjustment surface to be temperature-adjusted;
   a metal layer arranged above the temperature adjustment surface, the metal layer being a rectangle having first through fourth right angle corners in a plan view;
   a light-emitting element arranged above the temperature adjustment surface through the metal layer, the light-emitting element being located at a center of the metal layer in the plan view;
   a first relay member arranged above the temperature adjustment surface through the metal layer, the first relay member being located at the first right angle corner of the metal layer in the plan view;
   a first wiring layer arranged above a surface of the first relay member at an opposite side to the temperature adjustment surface;
   an element side wiring that is electrically connected between the light-emitting element and the first wiring layer;
   a first external terminal that is located at an outside of the metal layer in the plan view adjacent to a side between the first and second right angle corners of the metal layer; and
   a first terminal side wiring that is electrically connected between the first external terminal and the first wiring layer, wherein
   an area of the first wiring layer is smaller than an area of a region where the metal layer overlaps the first relay member in a plan view,
   the first relay member is laterally shifted from the light-emitting element in the plan view, and
   the first external terminal is laterally shifted from the metal layer in the plan view.

2. The light-emitting element module according to claim 1, wherein
   the temperature adjustment part is a Peltier element, and
   the temperature adjustment surface is one of a heat generation surface and a heat absorption surface of the Peltier element.

3. The light-emitting element module according to claim 1, wherein at least one of the element side wiring and the first terminal side wiring is a wire wiring.

4. The light-emitting element module according to claim 3, wherein a plurality of the first terminal side wirings are provided.

5. The light-emitting element module according to claim 1, wherein the first wiring layer includes a first end part to which the element side wiring is connected and a second end part to which the first terminal side wiring is connected, and extends along a direction in which the first end part and the second end part are arranged.

6. The light-emitting element module according to claim 5, wherein a width of the second end part is larger than a width of the first end part.

7. The light-emitting element module according to claim 6, wherein the first wiring layer includes a portion whose width is continuously reduced from a side of the second end part to a side of the first end part.

8. The light-emitting element module according to claim 1, wherein the first relay member includes a ceramic material.

9. The light-emitting element module according to claim 1, wherein the first wiring layer includes a surface layer including gold and an underlayer provided between the surface layer and the first relay member.

10. The light-emitting element module according to claim 9, wherein the underlayer includes a first layer including titanium and a second layer including palladium, which are laminated on the first relay member in this order.

11. The light-emitting element module according to claim 1, further comprising:
    a temperature detection element arranged above the temperature adjustment surface through the metal layer;
    a second relay member for the temperature detection element arranged above the temperature adjustment surface through the metal layer;
    a second wiring layer arranged on a surface of the second relay member at an opposite side to the temperature adjustment surface;
    a temperature detection element side wiring that is electrically connected between the temperature detection element and the second wiring layer;
    a second external terminal for the temperature detection element; and
    a second terminal side wiring that is electrically connected between the second external terminal and the second wiring layer.

12. A quantum interference apparatus, comprising a light-emitting element module according to claim 1.

13. An atomic oscillator, comprising a light-emitting element module according to claim 1.

14. An electronic apparatus, comprising a light-emitting element module according to claim 1.

15. A moving object, comprising a light-emitting element module according to claim 1.

* * * * *